United States Patent [19]

Miyake et al.

[11] 4,290,938
[45] Sep. 22, 1981

[54] THERMOSETTING INJECTION MOLDING COMPOUND

[75] Inventors: Hideo Miyake; Junichi Sakamoto, both of Otsu; Masakazu Sawaki, Kyoto; Mamoru Hara, Otsu, all of Japan

[73] Assignee: Toyo Boseki Kabushiki Kaisha Co., Ltd., Japan

[21] Appl. No.: 109,736

[22] Filed: Jan. 4, 1980

[30] Foreign Application Priority Data

Jan. 5, 1979 [JP] Japan .................................. 54-859

[51] Int. Cl.³ .......................... C08K 3/40; C08L 67/06
[52] U.S. Cl. .................................... 260/40 R; 525/36; 525/39; 525/40; 260/22 CB; 260/45.7 R; 260/45.7 P; 260/45.75 B
[58] Field of Search ................. 260/40 R; 525/36, 39, 525/40

[56] References Cited

U.S. PATENT DOCUMENTS

| | | | |
|---|---|---|---|
| 3,922,247 | 11/1975 | Hazen et al. ...................... | 260/40 R |
| 3,923,927 | 12/1975 | Miyake et al. .................... | 525/40 X |
| 3,926,902 | 12/1975 | Bowen .............................. | 260/40 R |

*Primary Examiner*—Carman J. Seccuro
*Attorney, Agent, or Firm*—Jones, Tullar & Cooper

[57] ABSTRACT

A thermosetting injection molding compound comprising a specific crystalline unsaturated polyester comprising (A) a crystalline unsaturated polyester of terephthalic acid/fumaric acid = 5/5 − 1/9 by mol (acid component) and 1,4-butanediol/other glycol = 7/3 − 10/0 (glycol component) and (B) a styrene type monomer and/or allyl type monomer, and having specific ranges of a viscosity, a melting point and an acid value, said crystalline unsaturated polyester resin being admixed with (C) a glass fiber and (D) other additives in a specific ratio. The thermosetting injection molding compound has no tackiness and has excellent flowability and mold filling properties and can give an excellent molded product having good appearance without flow marks, surge or the like, and hence, the thermosetting injection molding compound of the present invention is particularly suitable for the preparation of electric, electronic and automobile parts which require excellent heat resistance, electrical characteristics and fire retardant properties.

8 Claims, No Drawings

THERMOSETTING INJECTION MOLDING COMPOUND

The present invention relates to a thermosetting injection molding compound, more particularly a thermosetting injection molding compound having no tackiness although it contains a liquid monomer such as a styrene type monomer and/or an allyl type monomer.

Phenol molding compounds are widely used as thermosetting, dry injection molding compounds useful for electric, electronic and automobile parts. With the recent tendency of miniaturization of parts and making them compact and also with tightened regulations, it is required to improve various properties such as electrical characteristics, heat resistance and fire retardant properties of the parts in the electric, electronic and automobile fields. However, these properties, particularly electrical characteristics and heat resistance, depend on the properties of the phenol resin per se, and hence, the improvement of these properties is limited. The phenol molding compounds have also a problem of injuring health due to asbestos which is contained therein as a reinforcement. Accordingly, it is proposed to replace asbestos with glass fiber. However, the replacement of asbestos with glass fiber has the effect of lowering of the injection moldability of the compound.

Other thermosetting injection molding compounds used as electric, electronic and automobile parts are wet type molding compounds such as bulk molding compounds and premix and dry type molding compounds such as alkyd molding compounds and diallyl phthalate molding compounds. The wet type molding compounds are inconvenient because of the tackiness thereof and require a specific injection molding machine and further it is necessary to mold them under restricted conditions in order to obtain the desired products. On the other hand, the dry type molding compounds are prepared by using diallyl phthalate prepolymer which is solid at room temperature, and hence, it is impossible to mix such a compound as it is and a solvent must be used during mixing thereof in order to improve the dispersibility of the components and must be removed off after the mixing procedure, which results in a high cost. Moreover, the dry type molding compounds are also inferior in injection molding properties and hence can be used in only restricted utilities.

Under the circumstances, it has been proposed to use as a thermosetting injection molding compound an unsaturated polyester resin which is in a solid state at room temperature, instead of the conventional thermosetting injection molding compounds. Said solid unsaturated polyester resin is obtained by modifying the conventional liquid unsaturated polyester resin so as to give it crystallinity by using as the unsaturated polyester components a symmetric dicarboxylic acid and a glycol. These unsaturated polyesters are roughly classified as follows.

(1) Terephthalic acid/fumaric acid//ethylene glycol unsaturated polyesters (cf. Japanese Patent Publication (unexamined) Nos. 26282/1973 and 36290/1973, U.S. Pat. No. 3,652,470, and British Pat. No. 1,331,428).

(2) Fumaric acid//ethylene glycol (or neopentyl glycol) unsaturated polyesters (cf. Japanese Patent Publication (unexamined) Nos. 31787/1974, 75291/1975 and 102688/1975, and West German Pat. No. 1,720,490).

(3) Fumaric acid//a specific glycol unsaturated polyesters (cf. Japanese Patent Publication (unexamined) Nos. 9945/1971 and 131289/1974).

Among the above unsaturated polyesters, the polyesters (1) has limited compatibility with a styrene type monomer or allyl type monomer even in a molten state at a high temperature, and hence, it is difficult to obtain a homogeneous molding compound. Accordingly, it does not show homogeneous flowability and is difficult to fill into the mold in the injection molding thereof, and hence, there is merely obtained a molded product having undesirable flow marks and surge and having inferior properties. The polyesters (2) have insufficient crystallinity, and it is necessary to incorporate additionally a thickening agent in order to obtain a molding compound having no tackiness. Further, the molded product obtained therefrom has defects such as blistering and cracking, because of the high reactivity of the polyesters. In addition, the polyesters (3) are also inferior in the crystallinity, and further, an expensive specific glycol is used, and hence, the polyesters are not economical.

It has also been proposed to use 1,6-hexanediol as the symmetric glycol. Although the crystalline unsaturated polyester obtained by using 1,6-hexanediol is very compatible with a styrene type monomer or allyl type monomer, it has a low viscosity and hence the molding compound shows inferior flowability in the injection molding thereof and can not give a product having good appearance (the product has surge on the surface).

As a result of the present inventor's intensive study on improvement of thermosetting injection molding compounds of crystalline unsaturated polyesters, it has been found that when the components, viscosity, melting point and acid value of the crystalline unsaturated polyesters are restricted, the polyesters are very compatible with a styrene type monomer and/or allyl type monomer in a molten state at a high temperature and can homogeneously be mixed with conventional additives such as fillers, reinforcements, fire retardant agents, releasing agents, colorants, polymerization initiators, polymerization inhibitors, or the like to give the desired injection molding compound having no tackiness, and further that when the extension in flow test is regulated within a fixed range, the injection molding compound shows an excellent flowability and filling properties and can give the desired molded products having good appearance and excellent properties.

An object of the present invention is to provide improved thermosetting injection molding compounds containing a specific crystalline unsaturated polyester. Another object of the invention is to provide thermosetting injection molding compounds which have excellent properties and can give excellent molded products having good appearance and excellent properties, which are useful for electric, electronic and automobile parts. These and other objects and advantages of the invention will be apparent to the persons skilled in the art by the following description.

The thermosetting injection molding compound of the present invention comprises a crystalline unsaturated polyester resin which comprises (A) a crystalline unsaturated polyester consisting of acid components: terephthalic acid/fumaric acid=5/5 to 1/9 by mol and glycol components: 1,4-butanediol/other glycol=7/3 to 10/0 by mol, and having a Gardner-Holdt bubble viscosity of N to W, (measured in a 70% by weight solution in tetrachloroethane at 25° C.), a melting point of 50° to 130° C. and an acid value of not more than 20 and (B) a styrene type monomer and/or an allyl type monomer;

said crystalline unsaturated polyester resin being uniformly admixed with (C) a glass fiber, and (D) an additive selected from the group consisting of a filling agent, a fire retardant agent, releasing agent, colorant, polymerization initiator and polymerization inhibitor, said components being incorporated in the ratios of B/(A+B)=5 to 40% by weight, C/(A+B+C+D)=5 to 30% by weight, and (C+D)/(A+B)=90/10 to 40/60 by weight, and said molding compound having an extension in a disc flow test (measured by the method as disclosed in JIS K-6911) of 80 to 110 mm.

The thermosetting injection molding compound of the present invention has no tackiness and has excellent flowability and filling properties and hence can give a molded product having an excellent appearance. Moreover, the molding compound has excellent heat resistance, electrical characteristics and fire retardant properties. Particularly, it has a high heat distortion temperature more than 270° C. and a high bending strength at 200° C. Besides, the molding compound of the present invention is also superior to the conventional dry type molding compounds in electrical characteristics such as tracking resistance and dielectric strength and impact strength.

The thermosetting injection molding compound of the present invention is characterized in use of a crystalline unsaturated polyester having a higher viscosity than that of the conventional unsaturated polyesters, that is, it has a Gardner-Holdt bubble viscosity of N to W (measured in a 70% by weight solution in tetrachloroethane at 25° C.).

The acid components of the crystalline unsaturated polyester (A) are dicarboxylic acid components consisting essentially of terephthalic acid and fumaric acid. Terephthalic acid or its functional derivatives and fumaric acid are used as the starting materials. The terephthalic acid and fumaric acid are used in the ratio of 5/5 to 1/9 by mol, preferably 4/6 to 2/8 by mol. When maleic acid or maleic anhydride is used instead of fumaric acid, the unsaturated polyester obtained has an insufficient crystallinity and hence can not be used for the present invention.

The glycol components of the crystalline unsaturated polyester (A) is 1,4-butanediol alone or a combination of 1,4-butanediol and other glycol, which are used in the ratio of 7/3 to 10/0 by mol, preferably 8/2 to 9.5/0.5 by mol. The other glycol to be used together with 1,4-butanediol includes ethylene glycol, propylene glycol, neopentyl glycol, diethylene glycol, dipropylene glycol, 2,2,4-trimethyl-1,3-pentanediol, 1,5-pentanediol, 1,6-hexanediol, 2,2-dimethyl-3-hydroxypropyl, 2,2-dimethyl-3-hydroxypropionate, hydrogenated bisphenol A, bisphenol A ethylene oxide or propylene oxide adduct, or the like, among which propylene glycol, neopentyl glycol and dipropylene glycol are preferable.

Even when the molar ratio of terephthalic acid/fumaric acid is within the range of 5/5 to 1/9, if the molar ratio of 1,4-butanediol/other glycol is smaller than 7/3, there can not be obtained the desired molding compound having no tackiness. On the other hand, even when the molar ratio of 1,4-butanediol/other glycol is within the range of 7/3 to 10/0, if the molar ratio of terephthalic acid/fumaric acid is larger than 5/5, the molding compound has no tackiness but can not give the desired molded product having sufficient properties, and further, if the molar ratio of terephthalic acid/fumaric acid is smaller than 1/9, the molding compound has no tackiness, but the molded product obtained therefrom tends to show blistering or cracking and shows insufficient properties.

The crystalline unsaturated polyester (A) of the present invention has a Gardner-Holdt bubble viscosity (hereinafter, referred merely to viscosity) of N to W, preferably R to V. When the viscosity is larger than W, the unsaturated polyester can not uniformly be admixed with glass fiber and other additives, and hence, it has inferior flowability during injection molding. On the contrary, when the viscosity is smaller than N, the unsaturated polyester can be admixed with glass fiber and other additives, but fluidity during injection molding is uneven, and hence, there can not be obtained the desired molded product having good appearance (the molded product has surge on the surface).

The crystalline unsaturated polyester (A) of the present invention has a melting point of 50° to 130° C., preferably 60° to 120° C. When the melting point is lower than 50° C., there can not be obtained the desired molding compound having no tackiness, and further, the molding compound shows uneven flowability during injection molding, and hence, there can not be obtained the desired molded product having good appearance (the molded product shows flow marks and surge on the surface). On the other hand, when the melting point is higher than 130° C., the molding compound has no tackiness, but has inferior flowability during injection molding.

Moreover, the crystalline unsaturated polyester (A) of the present invention has an acid value of not higher than 20, preferably not higher than 15. When the acid value is over 20, the polyester can not uniformly be admixed with glass fiber and other additives, and hence, has inferior flowability during injection molding.

The crystalline unsaturated polyester resin of the present invention is a mixture of the crystalline unsaturated polyester (A) and at least one monomer selected from a styrene type monomer and allyl type monomer (B). The styrene type monomer and/or allyl type monomer (B) are mixed in an amount of 5 to 40 parts by weight, preferably 10 to 35 parts by weight, per 100 parts by weight of the crystalline unsaturated polyester resin. When the styrene type monomer and/or allyl type monomer are used in an amount of larger than 40% by weight, there can not be obtained the desired molding compound having no tackiness, and the molding compound does not show uniform flowability during injection molding and hence can not give the desired molded product having good appearance (the molded product has flow marks on the surface). On the other hand, when the monomers (B) are used in an amount of smaller than 5% by weight, the molding compound has inferior flowability during injection molding and can not give the desired molded product.

The styrene type monomer used in the present invention includes styrene, vinyltoluene, chlorostyrene, bromostyrene, t-butylstyrene, α-methylstyrene, divinylbenzene, or the like. The allyl type monomer used in the present invention includes diallyl orthophthalate, diallyl isophthalate, diallyl terephthalate, or the like. These monomers may be used alone or in a combination of two or more thereof.

When the crystalline unsaturated polyester is mixed with the styrene type monomer and/or allyl type monomer, other additives such as glass fiber, filling agent, fire retardant agent, releasing agent, colorant, polymerization initiator and polymerization inhibitor may simultaneously be mixed.

The glass fiber (C) to be incorporated into the injection molding compound has usually a length of 3 or 6 mm. The glass fiber is used in an amount of 5 to 30% by weight, preferably 8 to 25% by weight, based on the total weight of the molding compound. When the glass fiber is used in an amount of smaller than 5% by weight, the reinforcing effect of the glass fiber is small, and on the other hand, when the amount is larger than 30% by weight, the molding compound has very inferior flowability during injection molding and is difficult to mold.

The filling agent to be incorporated into the injection molding compound includes calcium carbonate, aluminum hydroxide, barium sulfate, calcium silicate, alumina, silica, clay, talc, woodmeal, rice full meal, diatomaceous earth, glass microballoon, pumice microballoon, synthetic resin microballoon, or the like. The fire retardant agent includes antimony trioxide, phosphor compounds (e.g. triethylphosphate), halogenated compounds (e.g. tetrabromodiphenyl ether), or the like. The releasing agent includes zinc stearate, calcium stearate, or the like. A colorant is optionally incorporated into the molding compound to give a color injection molding compound.

In order to obtain electric, electronic and automobile parts which require particularly excellent heat resistance, electrical characteristics and fire retardant properties, the filling agents such as calcium carbonate, aluminum hydroxide, barium sulfate, calcium silicate, alumina, silica, clay, talk, talc, diatomaceous earth, various microballoons are preferably incorporated into the injection molding compound. Since asbestos has a problem of injuring health of persons, it is not used.

The injection molding compound of the present invention may optionally be admixed with a low shrinking agent which is soluble in the styrene monomer or allyl monomer, such as polystyrene, polyvinylacetate, ethylene-vinylacetate copolymer, polyester, or the like. However, it is not necessary to incorporate any viscosity increasing agent such as magnesium oxide, calcium oxide, magnesium hydroxide or calcium hydroxide. It is one of the characteristics of the injection molding compound of the present invention that the injection molding compound has no tackiness notwithstanding incorporating no viscosity increasing agent.

The polymerization initiator to be incorporated into the injection molding compound of the present invention is preferably an organic peroxide which is decomposable at a medium or high temperature, since the molding compound is prepared with heating. Suitable examples of the organic peroxides are methyl ethyl ketone peroxide, cyclohexanone peroxide, t-butyl hydroperoxide, cumene hydroperoxide, diisopropylbenzene hydroperoxide, 2,5-dimethylhexane-2,5-dihydroperoxide, p-menthane hydroperoxide, di-t-butyl peroxide, t-butylcumyl peroxide, dicumyl peroxide, α,α'-bis(t-butylperoxy)-p-diisopropylbenzene, 2,5-dimethyl-2,5-di(benzoylperoxy)hexane, 2,5-dimethyl-2,5-di(t-butylperoxy)hexyne-3, decanoyl peroxide, lauroyl peroxide, stearoyl peroxide, benzoyl peroxide, t-butyl peroxy-2-ethyl-hexanoate, t-butyl peroxylaurate, t-butyl peroxybenzoate, di-t-butyl diperoxyphthalate, 2,5-dimethyl-2,5-di(benzoylperoxy)hexane, t-butyl peroxymaleate, 1,1,3,3-tetramethylbutyl peroxy-2-ethylhexanoate, or the like. These organic peroxides may be used alone or in a combination of two or more thereof, and are used in an amount of 0.5 to 5 parts by weight per 100 parts by weight of the crystalline unsaturated polyester resin.

The polymerization inhibitor to be incorporated into the injection molding compound includes p-benzoquinone, naphthoquinone, p-toluquinone, 2,5-diphenyl-p-benzoquinone, 2,5-di-acetoxy-p-benzoquinone, hydroquinone, p-t-butylcatechol, 2,5-di-t-butylhydroquinone, di-t-butyl-p-cresol, hydroquinone monomethyl ether, or the like, which may be used alone or in a combination of two or more thereof. The polymerization inhibitor is used in an amount of not more than 0.5 part by weight per 100 parts by weight of the crystalline unsaturated polyester resin.

A fibrous reinforcement such as synthetic fibers, carbon fibers, natural fibers or pulp may be used together with the glass fiber (C).

The other additive (D) used in the present invention denote the filling agents, fire retardant agents, releasing agents, colorants, polymerization initiators and polymerization inhibitors as mentioned above.

The mixing ratio of the glass fiber (C) and other additives (D) with the crystalline unsaturated polyester resin (A+B) may vary with the kinds of the glass fiber and other additives, but is usually in the range of $(C+D)/(A+B)=90/10$ to $40/60$ by weight, preferably 85/15 to 45/55 by weight.

When the mixing ratio of the glass fiber and other additives is larger than 90% by weight, the molding compound has an inferior flowability at the injection molding and can not give the desired molded product. On the other hand, when the mixing ratio of the glass fiber and other additives is smaller than 40% by weight, the molding compound shows uneven flowability in injection molding and inferior mold filling properties and can not give the desired molded product having good appearance (the molded product has flow marks and surge on the surface).

The injection molding compound is usually prepared by two steps of kneading and granulation with extrusion. The kneading step comprises uniformly kneading the crystalline unsaturated polyester resin and glass fiber and other additives with a kneader or a high speed mixer, or the like, preferably with a pressure kneader which has an excellent kneading efficiency. The kneading is preferably carried out at a temperature of 60° to 100° C. The step of granulation with extrusion comprises granulating the compound obtained in the kneading step with an extruder. The granulation with extrusion is also preferably carried out at a temperature of 60° to 100° C. Alternatively, the compound obtained by the kneading step may be cracked to form granular or powdery compound without subjecting extrusion, and the granular or powdery compound thus obtained may be injection-molded. In the present invention, the preparation of the injection molding compound can be accomplished without using any solvent, which is one of the characteristics of the present invention.

The injection molding compound of the present invention has an extension of 80 to 110 mm, preferably 85 to 105 mm, in the disc flow test as described in JIS K-6911 which is carried out under the conditions of a weight of the test sample: 3 g, a temperature of mold: 160° C., a pressure: 2,500 kg/cm$^2$, and a time for pressing: 30 seconds. When the extension in the disc flow test is included within the above range, the molding compound has excellent mold filling properties and can give the desired molded product having good appearance without showing flow marks and surge. When the extension is larger than 110 mm, the molding compound shows inferior mold filling properties and the molded product has bad appearance with voids, flow marks and surge. On the other hand, when the extension is smaller than 80 mm, the molding compound curves unfavourably during the filling into the mold.

In order to mold the injection molding compound of the present invention, it is not necessary to use any specific molding machine, but there can be used the conventional injection molding machine which are usually used for conventional phenol resin molding compounds. The injection molding compound of the present invention may be applied to other molding processes, such as compression molding or transfer molding.

The injection molding of the molding compound of the present invention is usually carried out under the following conditions:
  Temperature of mold 150°–170° C.
  Temperature of cylinder:
    nozzle part: 70°–90° C.
    hopper part: 20°–40° C.
  Rotary speed of screw: 70 r.p.m.
  Injection pressure: 1,400 kg/cm$^2$ or less
  Back pressure of screw: 0–5 kg/cm$^2$ The injection molding compound of the present invention is preferably in the form of pellet, particle or powder because of ease in handling thereof. Since no asbestos is present, the injection molding compound of the present invention presents no problem of health. The injection molding compound of the present invention is excellent stability within the cylinder of the injection molding machine and also has excellent nozzle touching and moldability, and hence, can give the desired molded product having good appearance and gloss surface without drawbacks such as blistering, cracking, flow marks and surge. Thus, the injection molding compound of the present invention is useful for the production of electric, electronic and automobile parts which require particularly excellent heat resistance, electrical characteristics and fire retardant properties.

The present invention will be illustrated by the following Examples and Reference Examples, but is not limited thereto. In the Examples and Reference Examples, "part" means part by weight unless specified otherwise. Besides, the various properties shown in Examples and Reference Examples are measured as follows.

Viscosity of the crystalline unsaturated polyester is measured in a 70% by weight solution in tetrachloroethane at 25° C. by using a Gardner-Holdt bubble viscosimeter. The viscosity is shown in the following manner: for instance, U−V: a medium viscosity of the values U and V, U+: a medium viscosity of the value U and the value of U−V, U: a medium viscosity of the value of T−U and the value U.

Acid value of the crystalline unsaturated polyester is measured by the method as described in JIS K-6901 using chloroform as the solvent.

Melting point of the crystalline unsaturated polyester is measured by using an automatic melting point apparatus (FP-1 type, made by METTLER CO.).

The molding compound is prepared by using a warming pressure kneader and a warming extrusion granulation machine equipped with a cutter.

Tackiness of the molding compound is evaluated as follows. That is, the molding compound particles are packed in a tube (diameter: 30 mm, length: 200 mm) in a depth of 10 cm, and it is kept in a constant temperature bath of 25° C. for 24 hours, and thereafter, the flow properties and blocking properties of the molding compound are observed with naked eye.

Flow properties of the molding compound are measured by the disc flow test as described in JIS K-6911, wherein the extension of disc (mm) is measured, under the conditions of weight of test sample: 3 g, temperature of mold: 160° C., pressure: 2,500 kg/cm$^2$, and pressing time: 30 seconds.

Injection moldability is tested by using an injection molding machine Nestal Duromat D-120 (made by Sumitomo Heavy Industries, Ltd.) under the following conditions:
  Temperature of mold: 160°±5° C.
  Temperature of cylinder:
    nozzle part: 90° C.
    hopper part: 40° C.
  Rotary speed of screw: 40–50 r.p.m.
  Injection pressure: 1,400 kg/cm$^2$
  Back pressure of screw: 0
  Cycle time:
    injection: 15 seconds or less
    curing: 60–120 seconds Mold filling properties during injection molding and the appearance of the molded product are evaluated as follows. The injection molding is carried out by using a mold for making a square bar sample (the size of the sample being suitable for the measurement of heat deformation temperature according to ASTM D 648) and a square bar sample with notch (the size of the sample being suitable for the measurement of Charpy impact strength as described in JIS K-6911). The mold filling properties are mainly evaluated by observing with naked eye the state of the square bar sample with a notch, and the appearance is mainly evaluated by observing with naked eye the square bar sample.

Among the physical properties of the molded product, bending strength, tensile strength, water absorption, insulation resistance, arc resistance, Charpy impact strength, and dielectric strength are measured by the method as described in JIS K-6911, and heat deformation temperature is measured by the method as described in ASTM D 648 (load: 18.5 kg/cm$^2$) by using the square bar sample as used above. Bending strength at elevated temperature is measured by the method as described in JIS K-6911 at 200° C. Tracking resistance is measured by the method of IEC Pub. 112. Fire retardband properties are measured by the test method of UL 94.

PREPARATION

Preparation of crystalline unsaturated polyester

Into a stainless steel autoclave equipped with a stirrer, a thermometer, a nitrogen gas introducing tube and a partial reflux condenser are charged terephthalic acid (5,482 parts), 1,4-butanediol (9,165 parts) and potassium titanyloxalate (5.9 parts), and the mixture is reacted at 210°–220° C. for about 1.5 hour. After cooling the reaction mixture to lower than 180° C., fumaric acid (7,777 parts), propylene glycol (860 parts), 1,4-butanediol (1,055 parts), phosphorous acid (6.2 parts) and hydroquinone (2.4 parts) are added to the mixture, and the mixture is reacted at 210° C. for about 8 hours with introducing nitrogen gas to give an unsaturated polyester (A) which has an acid value of 10, a melting point of 96° C. and a viscosity of U. According to NMR analysis, the unsaturated polyester (A) is composed of terephthalic acid: 33 mol, fumaric acid: 67 mol., 1,4-butanediol: 89 mol, and propylene glycol: 11 mol.

EXAMPLE 1

In the same manner as described in the above Rreparation, various crystalline unsaturated polyesters (A) to (C) as shown in Table 1 are prepared.

TABLE 1

| Poly-ester | Dicarboxylic acid Kind* | mol | Glycol Kind** | mol | Acid value | Viscosity | Melting point (°C.) |
|---|---|---|---|---|---|---|---|
| A | TPA | 33 | BD | 89 | 10 | U+ | 96 |
|   | FA | 67 | PG | 11 |   |   |   |
| B | TPA | 43 | BD | 81 | 17 | R | 116 |
|   | FA | 57 | NPG | 19 |   |   |   |
| C | TPA | 24 | BD | 94 | 5 | V+ | 92 |
|   | FA | 76 | DPG | 6 |   |   |   |

[Remarks]:
*TPA: Terephthalic acid, FA: Fumaric acid
**PG: Propylene glycol, BD: 1,4-Butanediol, NPG: Neopentyl glycol, DPG: Dipropylene glycol The crystalline unsaturated polyesters obtained above are each mixed and kneaded with styrene or diallyl phthalate, glass fiber and various additives in the ratio as shown in Table 2 with a pressure kneader at 80° C. The kneaded mixture is granulated with an extrusion granulation machine equipped with a cutter at 80° C. to give granular molding compounds (I) to (XI) having a diameter of about 4 mm as shown in Table 2. The granular molding compounds thus obtained have no tackiness and are free flowing and have flow properties as shown in Table 2.

The molding compounds have excellent mold filling properties and can give molded products having good appearance without surge and an excellent moldability as shown in Table 2.

TABLE 3

| Molding compounds | Bending strength (kg/mm²) | Tensile strength (kg/mm²) | Heat distortion temperature (°C.) |
|---|---|---|---|
| (I) | 10.8 | 3.9 | More than 240° C. |
| (II) | 11.4 | 4.1 | More than 240° C. |
| (III) | 9.6 | 4.2 | More than 240° C. |
| (IV) | 12.1 | 4.1 | More than 240° C. |

REFERENCE EXAMPLE 1

In the same manner as described in Preparation, various crystalline unsaturated polyesters (a) to (g) as shown in Table 4 are prepared.

TABLE 4

| Poly-ester | Dicarboxylic acid Kind | mol | Glycol Kind | mol | Acid value | Viscosity | Melting point (°C.) |
|---|---|---|---|---|---|---|---|
| a | TPA | 33 | BD | 90 | 10 | K | 89 |
|   | FA | 67 | PG | 10 |   |   |   |
| b | TPA | 32 | BD | 89 | 6 | X | 98 |
|   | FA | 68 | PG | 11 |   |   |   |
| c | TPA | 34 | BD | 88 | 27 | U+ | 94 |
|   | FA | 66 | PG | 12 |   |   |   |
| d | TPA | 52 | BD | 95 | 6 | W− | 133 |
|   | FA | 48 | PG | 5 |   |   |   |
| e | TPA | 33 | BD | 54 | 4 | T | 46 |
|   | FA | 67 | DPG | 66 |   |   |   |
| f | TPA | 55 | BD | 80 | 11 | U-V | 78 |
|   | FA | 45 | DPG | 20 |   |   |   |
| g | TPA | 23 | BD | 59 | 7 | V− | 69 |
|   | FA | 77 | NPG | " |   |   |   |

The crystalline unsaturated polyesters obtained above are each mixed and kneaded with styrene or

TABLE 2

| Molding compound | Crystalline unsaturated polyester*¹ | Styrene | Components (part) Calcium carbonate *2 | Glass fiber *3 | Zinc strearate | Dicumyl peroxide | p-Benzo-quinone | Flow properties (extension in disc flow test) (mm) | Appearance of molded product (surge on the surface) |
|---|---|---|---|---|---|---|---|---|---|
| I | (A) 1800 | 500 | 6500 | 1200 | 100 | 20 | 0.5 | 87 | Entirely not |
| II | (A) 2000 | 600 | 6300 | 1200 | 100 | 30 | 0.5 | 101 | Almost not |
| III | (A) 1700 | 700 | 6100 | 1500 | 100 | 20 | 0.5 | 91 | Almost not |
| IV | (A) 1800 | 500*⁴ | 6500 | 1200 | 100 | 20 | 0.5 | 92 | Entirely not |
| V | (B) 2000 | 300 | 6600 | 1000 | 100 | 20 | 0.5 | 86 | Almost not |
| VI | (B) 1800 | 500 | 6000 | 1500 | 100 | 20 | 0.5 | 90 | Entirely not |
| VII | (C) 2200 | 700 | 5500 | 1500 | 100 | 30 | 0.6 | 94 | Almost not |
| VIII | (C) 1900 | 600 | 6300 | 1200 | 100 | 20 | 0.5 | 89 | Entirely not |
| IX | (C) 2100 | 600 | 6700 | 1000 | 100 | 30 | 0.6 | 103 | Almost not |
| X | (C) 1700 | 800 | 5800 | 1700 | 100 | 20 | 0.5 | 101 | Almost not |
| XI | (C) 1900 | 600*⁴ | 6300 | 1200 | 100 | 20 | 0.5 | 93 | Entirely not |

[Remarks]:
*¹The alphabetical numbers of the crystalline unsaturated polyester are as shown in Table 1.
*²A commercial product: NS 1200 (made by Nitto Funka Kogyo K.K.)
*³A commercial product: ES-03-B-32 (made by Nippon Glass Fiber Co.)
*⁴Diallyl phthalate is used instead of styrene.

The properties of the molded products are shown in Table 3. As is clear from Table 3, the molded products show extremely excellent physical strength and heat resistance.

diallyl phthalate, glass fiber and various additives in the ratio as shown below with a pressure kneader at 80° C. The kneaded mixture is granulated with an extrusion granulation machine equipped with a cutter at 80° C. to give granular molding compounds (i) to (viii) having a diameter of about 4 mm as shown in Table 5.

| | |
|---|---|
| Crystalline unsaturated polyester | 1,800 parts |
| Styrene or diallyl phthalate | 500 parts |
| Calcium carbonate (NS 1200) | 6,500 parts |
| Glass fiber (ES-03-B-32) | 1,200 parts |
| Zinc stearate | 100 parts |
| Dicumyl peroxide | 20 parts |
| p-Benzoquinone | 0.5 parts |

TABLE 5

| Molding compound | Crystalline unsaturated polyester *1 | Flow properties (extension in disc flow test) (mm) | Mold Filling properties | Appearance (surge on the surface) |
|---|---|---|---|---|
| i | a | 108 | Bad | Many surges |
| ii | b | 73 | Incomplete (impossible to mold) | — |
| iii*2 | b | 76 | Bad | Many surges, burn mark |
| iv | c | 78 | Incomplete (impossible to mold) | — |
| v | d | 72 | Incomplete (impossible to mold) | — |
| vi*3 | e | — | — | — |
| vii | f | 110 | Bad | Many surges |
| viii | g | 116 | Bad | Extremely many surges |

[Remarks]:
*1 The alphabetical numbers of the crystalline unsaturated polyesters are as shown in Table 4.
*2 Diallyl phthalate is used instead of styrene.
*3 Since the molding compound has an tackiness and becomes block, it is not subjected to injection molding.

The molding compounds other than the compound (vi) have no tackiness and have free fluidity. However, the molding compounds are inferior in mold filling properties or can not be filled into the mold and hence are impossible to mold. The molding compounds having inferior mold filling properties into mold give undesirable molded products having many surges on the surface.

REFERENCE EXAMPLE 2

In the same manner as described in Preparation, various crystalline unsaturated polyesters (h) to (j) as shown in Table 6 are prepared.

TABLE 6

| Poly-ester | Dicarboxylic acid Kind | mol | Glycol Kind | mol | Acid value | Viscosity | Melting point (°C.) |
|---|---|---|---|---|---|---|---|
| h | TPA | 40 | EG | 100 | 12 | R | 52 |
|   | FA | 60 |    |     |    |   |    |
| i | TPA | 39 | EG | 81 | 10 | P | 50 |
|   | FA | 61 | PG | 19 |    |   |    |
| j | TPA | 36 | HD | 100 | 9 | R | 82 |
|   | FA | 74 |    |     |   |   |    |

*EG: Ethylene glycol, HD: 1,6-Hexanediol

The crystalline unsaturated polyesters obtained above are each mixed and kneaded with styrene, glass fiber and various additives in the ratio as shown in Table 7 with a pressure kneader at 80° C. The kneaded mixture is granulated with an extrusion granulation machine equipped with a cutter at 80° C. to give granular molding compounds (ix) to (xi) having a diameter of about 4 mm as shown in Table 7.

The molding compounds have no tackiness and are free flowing. The molding compounds (ix) and (xi) have inferior mold filling properties, but the molding compound (x) has good filling properties into mold. The molded products obtained from these molding compounds have many surges, and further the molded products obtained from the molding compounds (ix) and (x) show also flow marks on the surface.

TABLE 7

| Molding compound | Crystalline unsaturated polyester | Styrene | Calcium carbonate | Glass fiber | Zinc strearate | Dicumyl peroxide | p-Benzoquinone | Flow properties (extension in disc flow test) (mm) | Mold Filling properties | Appearance of molded product (surge on the surface) |
|---|---|---|---|---|---|---|---|---|---|---|
| ix | (h) 1800 | 500 | 6500 | 1200 | 100 | 20 | 0.5 | 105 | Bad (thin spot) | Many surges flow marks |
| x | (i) 1600 | 400 | 6400 | 1500 | 100 | 20 | 0.4 | 94 | Almost good | Many surges flow marks |
| xi | (j) 1800 | 500 | 6500 | 1200 | 100 | 20 | 0.5 | 110 | Bad | Extremely many surges |

REFERENCE EXAMPLE 3

In the same manner as described in Preparation, an unsaturated polyester is prepared in accordance with the following formulation:

| | |
|---|---|
| Terephthalic acid | 31 mol |
| Fumaric acid | 69 mol |
| 1,6-Hexanediol | 80 mol |
| Propylene glycol | 20 mol |

However, the polyester has no crystallinity and has a melting point of lower than room temperature and is soluble in styrene at room temperature.

Besides, when maleic anhydride is used instead of fumaric acid in the preparation of the crystalline unsaturated polyester (j) in Reference Example 2, there can not be obtained any crystalline unsaturated polyester but obtained an unsaturated polyester having a melting point of lower than room temperature and being soluble in styrene at room temperature.

EXAMPLE 2

In the same manner as described in Preparation, various crystalline unsaturated polyesters (D) to (F) as shown in Table 8 are prepared.

TABLE 8

| Poly-ester | Dicarboxylic acid Kind | mol | Glycol Kind | mol | Acid value | Viscosity | Melting point (°C.) |
|---|---|---|---|---|---|---|---|
| D | TPA | 41 | BD | 90 | 9 | T–U | 98 |
|   | FA | 59 | PG | 10 |   |   |   |
| E | TPA | 30 | BD | 89 | 11 | U+ | 94 |
|   | FA | 70 | NPG | 11 |   |   |   |
| F | TPA | 35 | BD | 79 | 12 | T+ | 91 |
|   | FA | 65 | PG | 21 |   |   |   |

The crystalline unsaturated polyesters (D) to (F) thus obtained are mixed and kneaded with various liquid monomers, glass fiber and various additives as shown in Table 9 in the ratio as shown in Table 9 with a pressure kneader at 80° C. The kneaded mixture is granulated with an extrusion granulation machine equipped with a cutter at 80° C. to give granular molding compounds (XII) to (XVI) having a diameter of about 4 mm as shown in Table 9.

mold filling properties and can give the desired molded products having almost no surge. The properties of the molded products are shown in Table 10. As is shown in the table, the products have extremely excellent strength and excellent heat distortion temperature.

TABLE 10

| Molding compounds | Properties of the molded products | | |
|---|---|---|---|
|  | Bending strength (kg/mm$^2$) | Tensile strength (kg/mm$^2$) | Heat distortion temperature (°C.) |
| (XII) | 10.2 | 4.2 | More than 240 |
| (XIII) | 8.4 | 3.6 | More than 240 |
| (XIV) | 12.4 | 3.9 | More than 240 |
| (XV) | 12.6 | 4.1 | More than 240 |
| (XVI) | 10.6 | 4.0 | More than 240 |

EXAMPLE 3

The crystalline unsaturated polyester (F) as prepared in Example 2 is mixed and kneaded with styrene or diallyl phthalate, various glass fibers and various additives as shown in Table 11 in the ratio as shown in Table 11 with a pressure kneader at 80° C. The kneaded mixture is granulated with an extrusion granulation machine equipped with a cutter at 80° C. to give a granular molding compounds (XVII) to (XXII) having a diameter of about 4 mm as shown in Table 11.

The molding compounds thus obtained have no tackiness and are free flowing, and have also excellent flow properties as shown in Table 11 and have excellent

TABLE 9

| Molding compound | Crystalline unsaturated polyester | Liquid monomer *1 | Components (parts) Calcium carbonate *2 | Glass fiber *3 | Zinc strearate | Dicumyl peroxide | p-Benzo-quinone | Flow properties (extension in disc flow test) (mm) | Appearance of molded product (surge on the surface) |
|---|---|---|---|---|---|---|---|---|---|
| XII | (D) 1800 | ST 500 | 6000 | 1500 | 100 | 20 | 0.5*4 | 92 | Almost not |
| XIII | (E) 1700 | CLST 500 ST 300 | 5800 | 1700 | 100 | 20 | 0.5 | 90 | Almost not |
| XIV | (F) 1800 | DAP 500 | 6000 | 1500 | 100 | 20*5 | 0.5 | 93 | Almost not |
| XV | (E) 1800 | DAP 300 DAIP 200 | 6000 | 1500 | 100 | 20*5 | 0.5*4 | 91 | Almost not |
| XVI | (E) 1800 | ST 200 DAP 300 | 6000 | 1500 | 100 | 20 | 0.5 | 93 | Almost not |

[Remarks]:
*1 ST: Styrene, CLST: Monochlorostyrene, DAP: Diallyl phthalate, DAIP: Diallyl isophthalate
*2 A commercial product: NS 1200
*3 A commercial product: ES-03-B-32
*4 Hydroquinone is used instead of p-benzo-quinone
*5 t-Butyl peroxybenzoate is used instead of dicumyl peroxide.

The molding compounds thus obtained have no tackiness and show free flowing, and have also excellent flow properties as shown in Table 9 and have excellent mold filling properties and can give the desired molded products having good appearance.

TABLE 11

| Molding compound | Components (part) | | | | | | | Flow properties (extension in disc test) (mm) | Appearance (surge on the surface) |
|---|---|---|---|---|---|---|---|---|---|
|  | Crystalline unsaturated polyester (F) | Styrene | Filling*1 agent | Glass*2 fiber | Zinc stearate | Dicumyl peroxide | p-Benzo-quinone | | |
| XVII | 1800 | 500 | NS 100, 5000 | ES-3 | 100 | 20 | 0.5 | 86 | Entirely not |

TABLE 11-continued

| Molding compound | Crystalline unsaturated polyester (F) | Styrene | Filling*1 agent | Glass*2 fiber | Zinc stearate | Dicumyl peroxide | p-Benzoquinone | Flow properties (extension in disc test) (mm) | Appearance (surge on the surface) |
|---|---|---|---|---|---|---|---|---|---|
| XVIII | 1800 | 500*3 | APS 100, 1500 NS 400, 3500 NS 1200, 3000 | ES-3 1200 | 100 | 20 | 0.5 | 98 | Almost not |
| XIX | 2000 | 600 | NS 200, 6000 Woodmeal, 700 | ES-3 1000 | 100 | 30 | 0.6*5 | 91 | Entirely not |
| XX | 1800 | 500 | NS 1200, 6500 | FES-6 1200 | 100 | 20*4 | 0.5 | 85 | Almost not |
| XXI | 1800 | 500*3 | NS 1200, 6500 | CS-6 1200 | 100 | 20 | 0.5 | 92 | Almost not |
| XXII | 1800 | 500 | NS 1200, 6500 | ACS-3 1200 | 100 | 20 | 0.5 | 92 | Almost not |

[Remarks]:
*1NS 100, NS 200, NS 400 and NS 1200: calcium carbonate (made by Nitto Funka Kogyo K.K.) APS 100: clay (made by Engelhard Minerals and Chemicals Corp.)
*2ES-3: ES-03-B-32 (a glass fiber made by Nippon Glass Fiber Co.) FES-6: FES-06-0408 (a glass fiber made by Fuji Fiber Glass Co.) CS-6: CS-6E-221 (a glass fiber made by Nitto Boseki K.K.) ASCS-3: CS-06-HB-830A (a glass fiber made by Asahe Fiber Glass Co.)
*3Diallyl phthalate is used instead of styrene.
*4t-Butyl peroxybenzoate is used instead of dicumyl peroxide.
*5Hydroquinone is used instead of p-benzoquinone.

EXAMPLE 4

The crystalline unsaturated polyester (E) or (F) as prepared in Example 2 is mixed and kneaded with styrene or diallyl phthalate, glass fiber and various additives as shown in Table 12 in the ratio as shown in Table 12 at 80° C. with a pressure kneader. The kneaded mixture is granulated with an extrusion granulation machine equipped with a cutter at 80° C. to give granular molding compounds (XXIII) to (XXV) having a diameter of about 4 mm as shown in Table 12.

TABLE 12

| Molding compound | Crystalline unsaturated polyester | Styrene | Filling*1 agent | Glass fiber | Zinc stearate | Dicumyl peroxide | p-Benzoquinone | Flow properties (extension in disc test) (mm) | Appearance (surge on the surface) |
|---|---|---|---|---|---|---|---|---|---|
| XXIII | (E) 1800 | 450 | NS 600, 2200 H42M, 4300 | 1200 | 100 | 20*3 | 0.5 | 86 | Entirely not |
| XXIV | (E) 1900 | 500*2 | NS 1200, 1900 H32, 3200 H42M, 1400 | 1200 | 100 | 20 | 0.5 | 98 | Almost not |
| XXV | (F) 1700 | 400 | NS 1200, 2700 H32, 4000 | 1200 | 100 | 20 | 0.5 | 100 | Almost not |

[Remarks]:
*1NS 600 and NS 1200: calcium carbonate (made by Nitto Funka Kogyo K.K.) H 32 and H 42M: aluminum hydroxide (Hydirite ®, made by Showa Keikinzoku K.K.)
*2Diallyl phthalate is used instead of styrene.
*3t-Butyl peroxybenzoate is used instead of dicumyl peroxide.

The molding compounds thus obtained have no tackiness and show free flowability and have also excellent flow properties as shown in Table 12 and have excellent mold filling properties and can give the desired molded product having good appearance.

The properties of the molded products obtained therefrom are shown in Table 13. As is shown in Table 13, the molded products have excellent strength, heat distortion temperature, water absorption, insulation resistance, arc resistance, tracking resistance and fire retardant properties.

TABLE 13

| Properties | Molding compounds | | |
|---|---|---|---|
| | XXIII | XXIV | XXV |
| Bending strength (kg/mm²) | 10.2 | 11.3 | 9.3 |
| Tensile strength (kg/mm²) | 4.3 | 4.4 | 3.8 |
| Heat distortion temperature (°C.) | More than 240 | More than 240 | More than 240 |
| Bending strength at 200° C. (kg/mm²) | 4.1 | 4.8 | 3.9 |
| Water absorption (% by weight) | 0.06 | 0.04 | 0.04 |
| Insulation resistance (Ω) | | | |
| At normal state | $10^{14}$ | $10^{14}$ | $10^{14}$ |
| After boiling | $10^{13}$ | $10^{13}$ | $10^{13}$ |
| Arc resistance (second) | More than 190 | More than 190 | More than 190 |
| Tracking resistance (V) | More than 900 | More than 900 | More than 900 |
| Charpy impact strength (kg . cm/cm²) | 6.3 | 7.0 | 5.8 |
| Dielectric strength (KV/mm) | 16 | 16 | 16 |
| Fire retardant properties | 94V-0 | 94V-0 | 94V-0 |

REFERENCE EXAMPLE 4

The crystalline unsaturated polyester (C) as prepared in Example 1 is mixed and kneaded with styrene or diallyl phthalate, glass fiber and various additives as shown in Table 14 in the ratio as shown in Table 14 with a pressure kneader at 80° C. The kneaded mixture is granulated with an extrusion granulation machine equipped with a cutter at 80° C. to give granular molding compounds (xii) to (xiv) having a diameter of about 4 mm as shown in Table 14.

TABLE 14

| Molding compound | Components (part) | | | | | | | Flow properties (extension in disc test) (mm) | Mold Filling properties Appearance of molded product |
|---|---|---|---|---|---|---|---|---|---|
| | Crystalline unsaturated polyester (c) | styrene | Filling agent | Glass fiber | Zinc stearate | Dicumyl peroxide | p-Benzoquinone | | |
| xii | 2400 | 600 | NS 100, 5400 | 1500 | 100 | 30 | 0.6 | 123 | Extremely many surges, flow marks |
| xiii | 2400 | 600* | NS 100, 5400 | 1500 | 100 | 30 | 0.5 | 126 | Extremely many surges |
| xiv | 1600 | 400 | H42, 6400 | 1500 | 100 | 20 | 0.5 | 75 | Filling being incomplete (impossible to mold) |

*Diallyl phthalate is used instead of styrene.

The molding compounds thus obtained have no tackiness and show free flowing, and have also flow properties as shown in Table 14. The molding compounds (xii) and (xiii) have extremely inferior mold filling properties and the molded products obtained therefrom show extrmely many surges, and the molded product obtained from the molding compound (xii) has also significant flow marks. The molding compound (xiv) is not completely filled into the mold and hence is impossible to mold.

REFERENCE EXAMPLE 5

In the same manner as described in Preparation, an unsaturated polyester composing of terephthalic acid/fumaric acid=33/67 by mol and propylene glycol/neopentyl glycol=9/1 by mol is prepared. The unsaturated polyester has a melting point of 72° C., a viscosity of D - E and an acid value of 12.

The unsaturated polyester thus obtained is mixed and kneaded with diallyl phthalate prepolymer, methanol, acetone, glass fiber and various additives in the following ratio with a pressure kneader at 80° C.

| Unsaturated polyester | 1800 parts |
|---|---|
| Diallyl phthalate prepolymer | 450 parts |
| Methanol | 150 parts |
| Acetone | 100 parts |
| Glass fiber (ES-03-B-32) | 1200 parts |
| Calcium carbonate (NS 1200) | 6500 parts |
| Zinc stearate | 100 parts |
| Dicumyl peroxide | 40 parts |
| p-Benzoquinone | 0.5 parts |

The thus kneaded mixture is granulated with an extrusion granulation machine equipped with a cutter at 80° C. to give a granular molding compound having a diameter of about 4 mm. The granular molding compound is treated with a hot air dryer at 70° C. to remove the solvent (methanol and acetone).

The molding compound thus obtained has no tackiness and shows free flowing and has an extension in the flow test of 90 mm. The molding compound has excellent filling properties into mold and the molded product obtained therefrom has almost no surge. The properties of the molded product are shown in Table 15.

TABLE 15

| Properties | |
|---|---|
| Bending strength (kg/mm$^2$) | 11.0 |
| Tensile strength (kg/mm$^2$) | 3.7 |
| Heat distortion temperature (°C.) | 210 |
| Bending strength at 200° C. (kg/mm$^2$) | Less than 1.5 |
| Water absorption (% by weight) | 0.04 |
| Insulation resistance (Ω) | |
| At normal state | 10$^{12}$ |
| After boiling | 10$^{12}$ |
| Arc resistance (second) | More than 190 |
| Tracking resistance (V) | 600 |
| Charpy impact strength (kg . cm/cm$^2$) | 4.5 |
| Dielectric strength (KV/mm) | 13 |

As is clear from data shown in Table 13 and Table 15, the molded products obtained from the thermosetting injection molding compounds of the present invention are superior to the molded products obtained from the conventional thermosetting dry type injection molding compounds in the heat resistances such as heat distortion temperature and heat bending strength, the electrical characteristics such as tracking resistance and dieletric resistance, and the impact resistance.

What is claimed is:

1. A thermosetting injection molding compound which comprises
   (A) crystalline unsaturated polyester which comprises (A) a crystalline unsaturated polyester consisting of acid components: terephthalic acid/fumaric acid=5/5 to 1/9 by mol and glycol components: 1,4-butanediol/other glycol=7/3 to 10/0 by mol, and having a Gardner-holdt bubble viscosity of N to W (measured in a 70% by weight solution in tetrachloroethane at 25° C.), a melting point of 50° to 130° C. and an acid value of not more than 20, and (B) at least one monomer selected from the group consisting of a styrene type monomer and an allyl type monomer;
   (C) a glass fiber; and
   (D) an additive selected from the group consisting of a filling agent, a fire retardant agent, a releasing agent, a colorant, a polymerization initiator and a polymerization inhibitor;

said components being incorporated in the ratios of B/(A+B)=5 to 40% by weight, C(A+B+C+D)=5 to 30% by weight, and (C+D)/(A+B)=90/10 to 40/60 by weight; and said molding compound having an extension in a disc flow test of 80 to 110 mm.

2. A thermosetting injection molding compound according to claim 1, wherein the acid components of the crystalline unsaturated polyester are terephthalic acid and fumaric acid in the ratio of 4/6 to 2/8 by mol and the glycol components are 1,4-butanediol and other glycol in the ratio of 8/2 to 9.5/0.5 by mol.

3. A thermosetting injection molding compound according to claim 2, wherein the other glycol is a member selected from the group consisting of ethylene glycol, propylene glycol, neopentyl glycol, diethylene glycol, dipropylene glycol, 2,2,4-trimethyl-1,3-pentanediol, 1,5-pentanediol, 1,6-hexanediol, 2,2-dimethyl-3-hydroxypropyl 2,2-dimethyl-3-hydroxypropionate, hydrogenated bisphenol A, and bisphenol A ethylene oxide or propylene oxide adduct.

4. A thermosetting injection molding compound according to claim 3, wherein the other glycol is a member selected from the group consisting of propylene glycol, neopentyl glycol and dipropylene glycol.

5. A thermosetting injection molding compound according to claim 1, wherein the monomer (B) is a member selected from the group consisting of styrene, vinyltoluene, chlorostyrene, bromostyrene, t-butylstyrene, α-methylstyrene, divinylbenzene, diallyl orthophthalate, diallyl isophthalate, and diallyl terephthalate.

6. A thermosetting injection molding compound according to claim 1, wherein the monomer (B) is incorporated in an amount of 10 to 35 parts by weight per 100 parts by weight of the crystalline unsaturated polyester resin (A+B).

7. A thermosetting injection molding compound according to claim 1, wherein the glass fiber (C) is incorporated in an amount of 8 to 25% by weight based on the total weight of the molding compound (A+B+C+D).

8. A thermosetting injection molding compound according to claim 1, wherein the glass fiber (C) and other additive (D) are incorporated in the range of (C+D)/(A+B)=85/15 to 45/55 by weight.

* * * * *